United States Patent
Tourancheau et al.

(10) Patent No.: US 7,395,483 B1
(45) Date of Patent: Jul. 1, 2008

(54) METHOD AND APPARATUS FOR PERFORMING ERROR-DETECTION AND ERROR-CORRECTION

(75) Inventors: Bernard Tourancheau, Miribel (FR); Ronald Ho, Mountain View, CA (US); Robert J. Drost, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 641 days.

(21) Appl. No.: 10/966,083

(22) Filed: Oct. 15, 2004

(51) Int. Cl.
*H03M 13/37* (2006.01)

(52) U.S. Cl. .................. 714/757; 714/776; 714/780; 714/804; 714/820

(58) Field of Classification Search .............. 714/757, 714/776, 780, 804, 820; *H03M 13/37*
See application file for complete search history.

(56) References Cited

U.S. PATENT DOCUMENTS 5,103,451 A * 4/1992 Fossey ................. 714/757
2003/0191835 A1 * 10/2003 Hauck et al. ............ 709/224
2004/0098660 A1 * 5/2004 Dong et al. .............. 714/776

\* cited by examiner

*Primary Examiner*—R. Stephen Dildine
(74) *Attorney, Agent, or Firm*—Park Vaughan & Fleming LLP

(57) ABSTRACT

One embodiment of the present invention provides a system that facilitates detecting and correcting errors. The system operates by receiving a data packet comprised of p words on a communication pathway, wherein each bit of a word is received on a separate data line in a set of data lines that comprise the communication pathway. The system also receives a time signature t on the communication pathway, wherein t contains per-bit error information for the p words in the data packet. As the data packet is received, the system performs an error-detection operation on each data bit of the data packet in parallel, wherein the error-detection operation generates per-bit error information for each bit position across the p words in the data packet. Finally, the system compares the generated per-bit error-information with the corresponding per-bit error information in the time signature t to determine if there exists an error.

14 Claims, 3 Drawing Sheets

METHOD AND APPARATUS FOR PERFORMING ERROR-DETECTION AND ERROR-CORRECTION

BACKGROUND

1. Field of the Invention

The present invention relates to the design of communication pathways within digital systems. More specifically, the present invention relates to a method and an apparatus for performing error-detection and/or error-correction on data packets transmitted across multiple data lines within a digital system.

2. Related Art

As computer systems become increasingly faster, data must be transmitted between computer system components at increasingly faster rates. These faster transmission rates increase the likelihood of communication errors. These communication errors may cause a particular data bit to flip its value, or they may cause a bit to always transmit a zero or one regardless of its intended value. The goal of error-detection and error-correcting systems is to detect and recover from such communication errors.

In a multi-hop communication network, error-detection/correction can be done at the receiver of the data and/or along the communication media at each hop. Traditional error-detection/correction in communication systems is done in space: the entire data word, from bit 0 to bit n (where n can be, for example, 8, 16, 32, or 64 bytes), is examined and error-checked/corrected all at once. This check is repeated for each word in the sequence of words that make up a packet of data. For example, a data packet may include 64 such words, and each of these 64 words is processed individually.

These traditional methods of error-detection and correcting are not without their drawbacks. An error-correcting operation typically requires time proportional to $\log_2 n$ to examine a full n-bit data word. For example, performing a parity check over 64 bits requires six levels of two-input XOR gates. In addition, the width of the network has to be expanded to handle the additional bits required for error detection. In a typical system with 64-bit words and standard Error Correction Codes (ECC), the network must be expanded by eight bits to handle the ECC information.

In addition to the increased network requirements, traditional systems require the whole word to be received before error-correction analysis can begin. Because of the complexity and the time delay that results, several packets can pass through a station before it is determined that one of the words was corrupt.

Hence, what is needed is a method and an apparatus for performing error-detection and error-correction on a communication network without the problems listed above.

SUMMARY

One embodiment of the present invention provides a system that facilitates detecting and correcting errors. The system operates by receiving a data packet comprised of p words on a communication pathway, wherein each bit of a word is received on a separate data line in a set of data lines that comprise the communication pathway. The system also receives a time signature t on the communication pathway, wherein t contains per-bit error information for the p words in the data packet. As the data packet is received, the system performs an error-detection operation on each data bit of the data packet in parallel, wherein the error-detection operation generates per-bit error information for each bit position across the p words in the data packet. Finally, the system compares the generated per-bit error-information with the corresponding per-bit error information in the time signature t to determine if there exists an error.

In a variation on this embodiment, the system forwards the data packet and the time signature t to a destination along with an error flag e, wherein e contains per-bit error indication information which indicates errors for corresponding bit-positions for the p words in the data packet.

In a variation on this embodiment, each of the p words in the data packet includes a traditional word-based error-detection code, which is transmitted on separate data lines in the set of data lines. The system then performs traditional word-based error-detection on the p words in the data packet to determine if there is an error in a word in the p words. If a word is determined to have an error, the system uses the per-bit error indication information to determine the position of an incorrect bit in the word.

In a variation on this embodiment, time signature t comprises multiple consecutive words on the data channel.

In a variation on this embodiment, the system divides the packet into a plurality of sub-packets and generates time signatures $t_n$ for each of the sub-packets, and then interleaves the time signatures $t_n$ between the sub-packets when the packet is forwarded to a destination.

In a further variation, the per-bit error indication information in error flag e is stored in a bit position other than the bit position which the error indication information is calculated for to facilitate indicating a "stuck-at" fault on a data line which is different than a data line upon which the "stuck-at" fault arises.

In a further variation, error flag e is only sent when errors are detected.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Traditional Error-Detection

Figure 1:
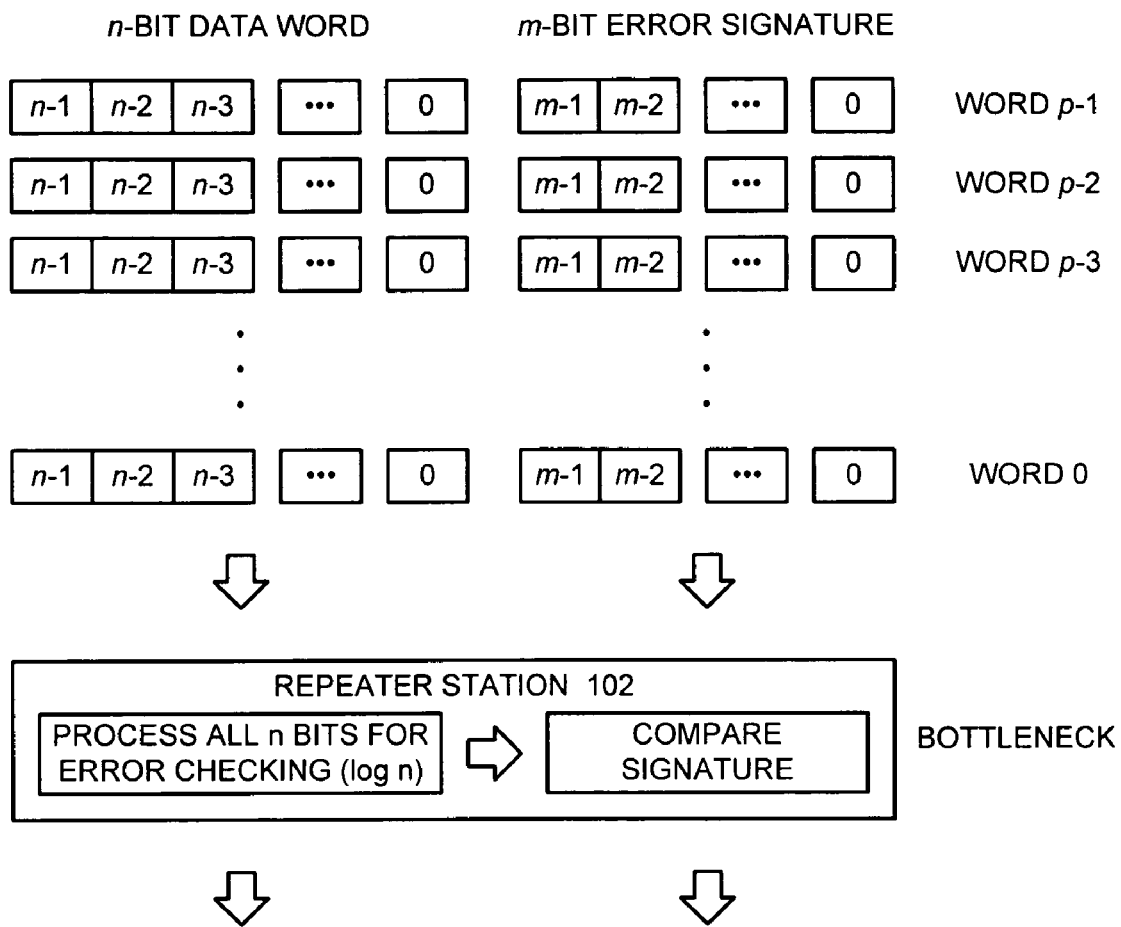
FIG. 1 illustrates a traditional error-detection system.

FIG. 1 illustrates a traditional error-detection system 100. In this system, a packet consists of p words (often also called "flits"), each consisting of n bits of data and m bits of error signature appended to the word. As each word passes through the repeater station 102, the n data bits are processed (an operation generally of $\log_2 n$ complexity) and the result is compared to the m-bit error signature. This error detection in the repeater hop can potentially create a bottleneck in the system.

Speeding up these traditional word-based operations is extremely costly in power and area, which makes these error-detection/correcting operations very expensive. In a system with a large-span communication fabric and multiple hops between transmitter and receiver, in-flight error-detection/correcting becomes mandatory to ensure system reliability, but it can add a damaging amount of latency (and/or power and area) to each repeater station.

Time-Based Error-Detection

Figure 2:
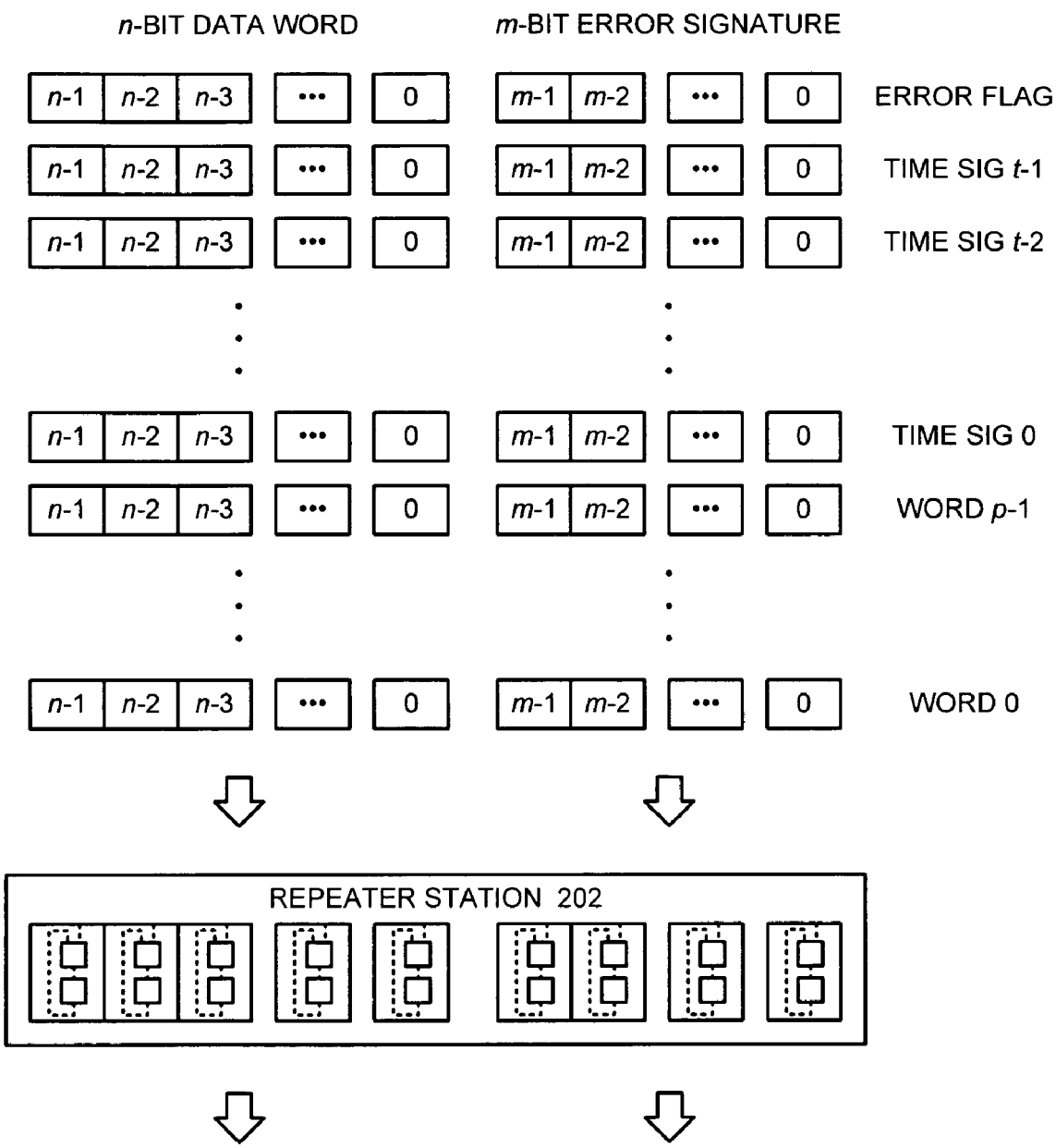
FIG. 2 illustrates a time-based error detection system in accordance with an embodiment of the present invention.

FIG. 2 illustrates a time-based error detection system 200 in accordance with an embodiment of the present invention. In this embodiment, the sender sends a packet of p words (including control words in the header appropriate for the network protocol). Each word is the full width of the physical network, and can include a traditional word-based error detection/correction signature as is illustrated in FIG. 2. Note that the time-based error detection/correction of the present system does not preclude the use of traditional word-based schemes, which can be done in-flight at additional expense. The traditional word-based schemes can also be executed at the end of the transmission.

Following the packet, the sender also transmits a time signature, which includes a series of t words that contain per-bit error information, such as parity bits, ECC bits, or CRC bits. These are calculated prior to transmission and only relate to the contents of each bit position. For example, consider a system with 70-word packets (p=70) that uses simple parity. In this system, the signature is a single word (t=1) in which bit 0 contains the parity of all of the $0^{th}$ bits in the entire packet of 70 words, bit 1 contains the parity of all the $1^{st}$ bits in the entire packet, and so on. Finally, following the data, the sender transmits a blank word, initialized to all zeros, which functions as an "error flag." Note that the error flag could also be initialized to all ones, or any other combination therein.

Once in flight, as a packet enters a repeater station, such as repeater station 202, within the repeater station the packet header tells repeater station 202 to reset its state. As the packet is repeated by repeater station 202, repeater station 202 performs a pipelined error detection/correction operation. For each bit, independent of other bits, repeater station 202 records information for each word in the packet and performs on-the-fly parity (or ECC or CRC), storing any required state locally. At the end of the packet, repeater station 202 knows whether or not it saw an error at each bit position in the packet. If repeater station 202 sees an error, repeater station 202 sets a corresponding bit in the error flag.

In FIG. 2, repeater station 202 is illustrated with a simple representation of some local calculation and state storage. The dashed boxes in repeater station 202 might be, for example, a simple XOR gate and a latch. The key idea is that the boxes do not need to communicate across the space dimension between bits. Instead, they only need to communicate with themselves over time. At the receiver, the error record can be examined for errors. With suitable schemes, some errors can be corrected, and those that cannot be corrected can be re-requested through the communication network.

Note that these time-based and traditional space-based schemes can be combined to space/time-locate a single error. For example, if parity is done on a per-bit time basis and also on a per-word space-basis, a single error is easily identified by the intersection of the violating word and violating bit.

Also note that in one embodiment of the present invention, the invention can be adjusted to the failure rate or the level of error-checking needed at a given place or time. This can be accomplished by expanding time signature t to t–n which results in an increased time signature to data word ratio. This allows for greater flexibility and usage of available resources.

Process of Time-Based Error-Detection

Figure 3:
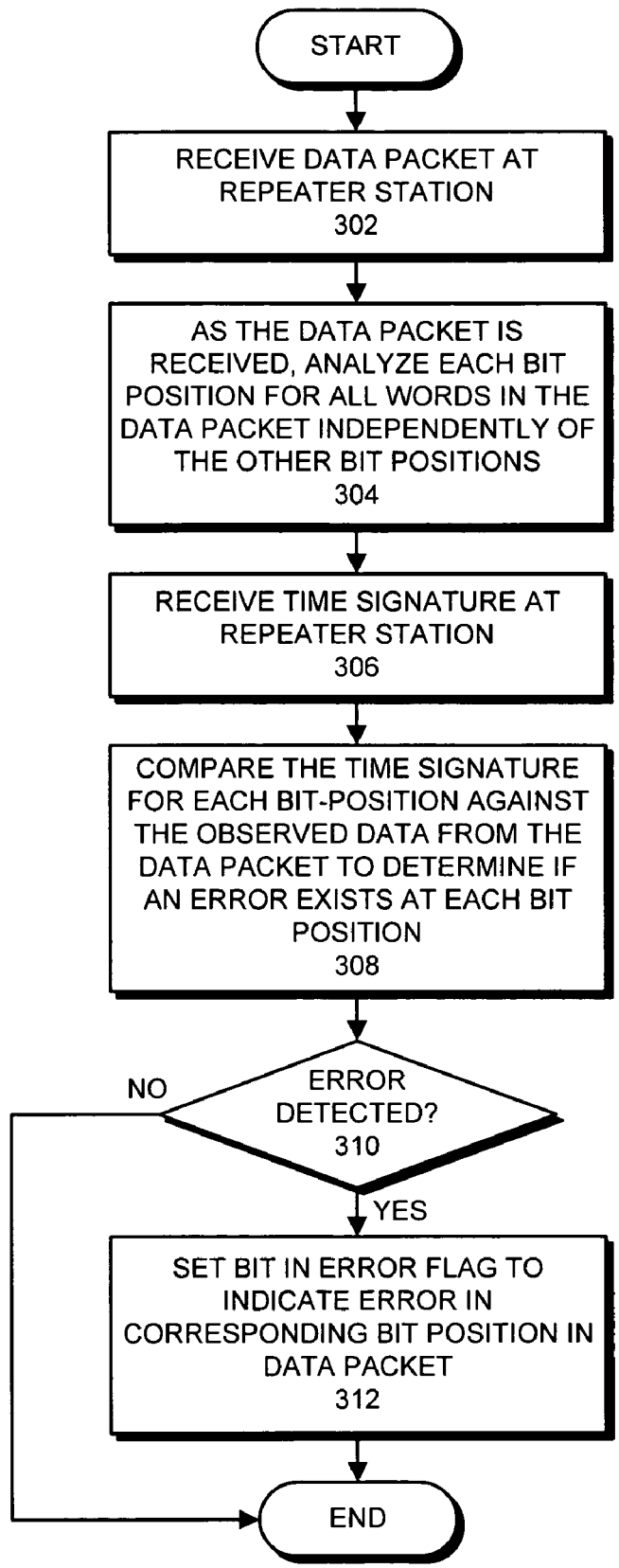
FIG. 3 presents a flowchart illustrating the process of time-based error-detection in accordance with an embodiment of the present invention.

FIG. 3 presents a flowchart illustrating the process of time-based error-detection in accordance with an embodiment of the present invention. The system starts when a data packet is received at repeater station 202 (step 302). As the packet is received, repeater station 202 analyzes each bit position independently of the other bit positions to calculate a time signature for each bit position (step 304).

Next, the system receives the time signature at repeater station 202 (step 306), and compares the time signature for each bit-position against the observed data from the data packet to determine if an error exists at each bit position (step 308). Note that the time signature can include multiple words to facilitate various error detection and correction schemes, such as ECC and CRC. If an error is detected (step 310), the system sets a bit in the error flag to indicate an error in the corresponding bit position in the data packet (step 312). Note that the system can optionally correct the error, as well as request that the sender resend the packet. Also note that the error signature can include multiple words to indicate the presence of multiple errors at any given bit position. For example, an error signature of two words can indicate zero, one, two, or three errors at any given bit position. In one embodiment of the present invention, the absence of an error signature indicates that no errors were detected.

In another embodiment of the present invention, the system divides the packet into sub-packets and interleaves time signatures for the sub-packets between the sub-packets to facilitate performing error-detection and error-correction on smaller amounts of data.

In one embodiment of the present invention, the system also shifts the bit position of the time signature and the error flag by a specified number of bits from the bit-position being analyzed. This facilitates eliminating problems that can arise with "stuck-at" faults by indicating a "stuck-at" fault on a data line which is different then the data line upon which a "stuck-at" fault arises.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for performing error-detection and/or error-correction, comprising:

receiving a data packet comprised of p words on a communication pathway, wherein each bit of a word is received on a separate data line in a set of data lines that comprise the communication pathway;

receiving a time signature t on the communication pathway, wherein t contains per-bit error information for the p words in the data packet; and performing an error-detection operation on each data bit of the data packet in parallel, wherein the error-detection operation generates per-bit error information for each bit position across the p words in the data packet; and comparing the generated per-bit error-information with the corresponding per-bit error information in the time signature t to detect and/or correct errors in the data packet.

2. The method of claim 1, further comprising forwarding the data packet and the time signature t to a destination along with an error flag e, wherein e contains per-bit error indication information which indicates errors for corresponding bit-positions for the p words in the data packet.

3. The method of claim 1, wherein each of the p words in the data packet includes a traditional word-based error-detection code, which is transmitted on separate data lines in the set of data lines, and wherein the method further comprises:

performing traditional word-based error-detection on the p words in the data packet to determine if there is an error in a word in the p words; and if a word is determined to have an error, using the per-bit error indication information to determine the position of an incorrect bit in the word.

4. The method of claim 1, wherein time signature t comprises multiple consecutive words on the data channel.

5. The method of claim 1, further comprising dividing the packet into a plurality of sub-packets;

generating time signatures $t_n$ for each of the sub-packets; and interleaving time signatures $t_n$ between the sub-packets when the packet is forwarded to a destination.

6. The method of claim 2, wherein the per-bit error indication information in error flag e is stored in a bit position other than the bit position which the error indication information is calculated for to facilitate indicating a "stuck-at" fault on a data line which is different than a data line upon which the "stuck-at" fault arises.

7. The method of claim 2, wherein error flag e is only sent when errors are detected.

8. An apparatus for performing error-detection and/or error-correction, comprising:

a receiving mechanism configured to receive a data packet comprised of p words on a communication pathway, wherein each bit of a word is received on a separate data line in a set of data lines that comprise the communication pathway;

wherein the receiving mechanism is additionally configured to receive a time signature t on the communication pathway, wherein t contains per-bit error information for the p words in the data packet; and a detection mechanism configured to perform an error-detection operation on each data bit of the data packet in parallel, wherein the error-detection operation generates per-bit error information for each bit position across the p words in the data packet; and a comparison mechanism configured to compare the generated per-bit error-information with the corresponding per-bit error information in the time signature t to detect and/or correct errors in the data packet.

9. The apparatus of claim 8, further comprising a forwarding mechanism configured to forward the data packet and the time signature t to a destination along with an error flag e, wherein e contains per-bit error indication information which indicates errors for corresponding bit-positions for the p words in the data packet.

10. The apparatus of claim 8, wherein each of the p words in the data packet includes a traditional word-based error-detection code, which is transmitted on separate data lines in the set of data lines, and wherein the apparatus further comprises:

a traditional detection mechanism configured to perform traditional word-based error-detection on the p words in the data packet to determine if there is an error in a word in the p words; and wherein if a word is determined to have an error, the comparison mechanism is further configured to use the per-bit error indication information to determine the position of an incorrect bit in the word.

11. The apparatus of claim 8, wherein time signature t comprises multiple consecutive words on the data channel.

12. The apparatus of claim 8, further comprising a division mechanism configured to divide the packet into a plurality of sub-packets;

a generating mechanism configured to generate time signatures $t_n$ for each of the sub-packets; and an interleaving mechanism configured to interleave time signatures $t_n$ between the sub-packets when the packet is forwarded to a destination.

13. The apparatus of claim 9, wherein the forwarding mechanism is further configured to store the per-bit error indication information in error flag e in a bit position other than the bit position which the error indication information is calculated for to facilitate indicating a "stuck-at" fault on a data line which is different than a data line upon which the "stuck-at" fault arises.

14. The apparatus of claim 9, wherein error flag e is only sent when errors are detected.

* * * * *